United States Patent
Kung et al.

(10) Patent No.: US 6,894,904 B2
(45) Date of Patent: May 17, 2005

(54) TAB PACKAGE

(75) Inventors: Moriss Kung, Taipei Hsien (TW); Kwun-Yao Ho, Taipei Hsien (TW)

(73) Assignee: Via Technologies, Inc., Taipei Hsien (TW)

( * ) Notice: Subject to any disclaimer, the term of this patent is extended or adjusted under 35 U.S.C. 154(b) by 0 days.

(21) Appl. No.: 10/248,554

(22) Filed: Jan. 29, 2003

(65) Prior Publication Data

US 2004/0042185 A1 Mar. 4, 2004

(30) Foreign Application Priority Data

Sep. 3, 2002 (TW) ........................................ 91120048 A

(51) Int. Cl.$^7$ ................................................. H01R 9/00
(52) U.S. Cl. ........................ 361/774; 361/772; 361/813; 257/666
(58) Field of Search ................................. 361/774, 772, 361/813, 702, 709, 723; 257/668, 686, 777, 692, 672, 666, 696; 174/260, 268, 252

(56) References Cited

U.S. PATENT DOCUMENTS

| | | | | |
|---|---|---|---|---|
| 5,157,478 A | * | 10/1992 | Ueda et al. | 257/796 |
| 6,036,173 A | * | 3/2000 | Neu et al. | 257/668 |
| 6,084,775 A | * | 7/2000 | Bartley et al. | 361/705 |
| 6,326,696 B1 | * | 12/2001 | Horton et al. | 257/777 |
| 6,649,833 B1 | * | 11/2003 | Caletka et al. | 174/52.2 |
| 2003/0052420 A1 | * | 3/2003 | Suzuki et al. | |

* cited by examiner

Primary Examiner—Kamand Cuneo
Assistant Examiner—Hung S. Bui
(74) Attorney, Agent, or Firm—Jianq Chyun IP Office

(57) ABSTRACT

A tape automated bonding (TAB) package and a method for fabricating the same is provided. A chip (a wire-bond chip or a flip chip) is bonded to a tape carrier through thermal compression. The chip and the tape carrier are encapsulated inside a molding compound. To enhance the TAB package thermally, a heat sink is attached to the backside of the chip.

8 Claims, 7 Drawing Sheets

TAB PACKAGE

CROSS REFERENCE TO RELATED APPLICATIONS

This application claims the priority benefit of Taiwan application serial no. 91120048, filed Sep. 3, 2002.

BACKGROUND OF INVENTION

1. Field of Invention

The present invention relates to a tape automated bonding (TAB) packaging structure and method of fabricating the same. More particularly, the present invention relates to a TAB packaging structure having a heat sink thereon and a method of fabricating the same.

2. Description of Related Art

In this information consciousness society, multi-media applications are being developed at a tremendous pace. To keep up with this trend, integrated circuit packages inside electronic devices must match a set of corresponding demands for digital input, networking, local area connection and personalized usage. In other words, each electronic device must be highly integrated so that more powerful programs can be executed at a higher speed and yet each package has to occupy less space and cost less. Due to the miniaturization and densification of integrated circuit packages, most packages have an edge length only 1.2 times the encapsulated chip or a package area 1.25 times the chip area. Hence, each package is able to provide powerful functions within a very small area. Furthermore, each chip package can be easily mounted on a printed circuit board using standard surface mount technology (SMT) and common equipment. Therefore, chip packages are mostly welcomed by the industry. The most common types of chip packages include bump chip carrier (BCC) package, quad flat nonleaded (QFN) package and lead frame type package.

FIG. 1 is a schematic cross-sectional view of a conventional bump chip carrier package. As shown in FIG. 1, the bump chip carrier (BCC) package mainly comprises a silicon chip 100, a layer of adhesive glue 104, a plurality of bonding wires 106, a plurality of terminals 108 and a plastic package body 110. The chip 100 has a plurality of bonding pads 102 on its top surface and contains a layer of adhesive glue 104 on its back surface. The bonding pads 102 on the chip 100 are electrically connected to the terminals 108 through the bonding wires 106. The plastic package body 110 encapsulates the chip 100 and the bonding wires 106. In addition, the adhesive glue 104 at the back surface of the chip 100 is exposed outside the plastic body 110. Through the terminals 108, the chip 100 can communicate electrically with other electronic devices or a host board. However, to produce this type of package structure, an etching operation is needed to expose the adhesive glue 104 at the back of the chip 100 and shape the terminals 108. Hence, the structure is a bit complicated to fabricate.

FIG. 2 is a schematic cross-sectional view of a conventional quad flat nonleaded package. As shown in FIG. 2, the quad flat nonleaded (QFN) package mainly comprises a chip 200, a layer of adhesive glue 204, a plurality of bonding wires 206a, a plurality of bonding wires 206b, a lead frame 208 and a plastic package body 210. The lead frame 208 has a die pad 208a and a plurality of leads 208b. The chip 200 has a plurality of bonding pads 202 on the upper surface. The back surface of the chip 200 is attached to the die pad 208a through the adhesive glue layer 204. A portion of the bonding pads 202 on the upper surface of the chip 200 are electrically connected to the leads 208b through respective bonding wires 206b. Meanwhile, another portion of the bonding pads 202 on the upper surface of the chip 200 are electrically connected to the die pad 208b (normally ground pads) through respective bonding wires 206a. The plastic package body 210 encapsulates the chip 200, the adhesive glue 204 and the bonding wires 206a, 206b such that one side of the die pad 208a and the leads 208b are exposed. The exposed surface of the die pad 208a increases the heat dissipating capacity of the package while the exposed leads 208b facilitates electrical connection with other devices or a host board.

FIG. 3 is a schematic cross-sectional view of a conventional lead frame type package. As shown in FIG. 3, the lead frame type package mainly comprises a chip 300, a layer of adhesive glue 304, a plurality of bonding wires 306, a lead frame 308 and a plastic package body 310. The lead frame 308 has a die pad 308a and a plurality of leads 308b. The upper surface of the chip 300 has a plurality of bonding pads 302 thereon. The back surface of the chip 300 is attached to the die pad 308a through the layer of adhesive glue 304. The bonding pads 302 on the chip 300 are electrically connected to the leads 308b through the bonding wires 306. The plastic package body 310 encapsulates the chip 300, the adhesive glue 304, the bonding wires 306, the die pad 308a and a portion of the leads 308b. Thus, the leads 308b exposed outside the package body 310 can be electrically connected with other carriers. Heat generated by the package is channeled outside through the leads or an externally attached heat sink. Consequently, heat dissipation capacity for this type of package is usually low.

All the aforementioned packages have a so-called wire-bonding chip design. In other words, the chip is electrically connected to the package through bonding wires. Bonding wires not only increase overall thickness of a package, but also increase overall circuit path compared with a conventional flip-chip packaging technique. Moreover, to package a wire-bonding chip into a flip-chip package, a wiring redistribution is required. After the redistribution process, overall circuit length will be increased so that parasitic inductance problem may crop up.

SUMMARY OF INVENTION

Accordingly, one object of the present invention is to provide a tape automated bonding (TAB) package structure and a corresponding fabrication method that can reduce overall thickness of the package and provide a shorter circuit path with better electrical performance.

To achieve these and other advantages and in accordance with the purpose of the invention, as embodied and broadly described herein, the invention provides a TAB package structure. The package comprises a tape carrier, a chip, a plurality of electrical contacts and a heat sink attached to the backside of the chip. The chip is attached to the tape carrier. The electrical contacts are positioned between the chip and the tape carrier so that the bonding pads on the chip and the inner leads on the tape carrier are electrically connected. In addition, a molding compound is applied over the tape carrier so that the chip and the tape carrier are encapsulated to form an integrator unit.

In the TAB package structure of this invention, the tape carrier comprises a tape, a plurality of leads and a heat sink suitable for attaching to the active surface of the chip. The tape has a device opening and a plurality of outer lead openings. The leads are placed over the tape and each lead can be divided into an inner lead section and an outer lead section. The outer lead sections are exposed through the outer lead openings. The heat sink is placed over the tape in a position corresponding to the device opening.

The tape inside the TAB package structure of this invention is made from a material such as polyimide and the leads on the tape are made from a material such as copper. Gold stud bumps or solder stud bumps may be used as contacts for connecting the chip with the tape carrier electrically.

According to this invention, the leads on the tape carrier and the surface of the heat sink may include an electroplated layer such as a nickel/alloy layer or a lead-tin alloy layer. Furthermore, the space between the heat sink and the active surface of the chip may include an adhesive glue layer for conducting heat from the chip to the heat sink.

This invention also provides a method of fabricating a TAB package. First, a tape having a device opening and a plurality of outer lead openings thereon is provided. A conductive layer having a plurality of bumps thereon is provided. The bumps correspond in position to the device opening and the outer lead openings on the tape. The tape and the conductive layer are attached to each other. A portion of the conductive layer is removed to form a heat sink and a plurality of leads. The heat sink, the leads and the tape together form a tape carrier. A chip having an active surface is provided. The active surface of the chip has a plurality of bonding pads. The chip is placed on the tape carrier and then a thermal compression process is carried out. A resin encapsulation process is carried out to encapsulate the chip and the tape carrier and form an integrated unit. A second heat sink is provided. The second heat sink is attached to the backside of the chip.

This invention also provides a second method of fabricating a tape automated bonding (TAB) package. First, a tape having a device opening and a plurality of outer lead openings thereon is provided. A conductive layer is also provided. The tape and the conductive layer are attached to each other. A portion of the conductive layer is removed to form a heat sink and a plurality of leads. The heat sink, the leads and the tape together form a tape carrier. A chip having an active surface is provided. The active surface of the chip has a plurality of bonding pads. The chip is placed on the tape carrier and then a thermal compression process is conducted. An injection molding is carried out to encapsulate the chip and the tape carrier into an integrative unit. Outer lead contacts each connected electrically with a corresponding outer lead are formed inside the outer lead openings. A second heat sink is provided. The second heat sink is attached to the backside of the chip.

This invention also provides a method of fabricating a tape carrier. First, a tape having a device opening and a plurality of outer lead openings thereon is provided. A conductive layer having a plurality of bumps thereon is provided. These bumps correspond in position to the device opening and the outer lead openings on the tape. The tape and the conductive layer are attached to each other. A portion of the conductive layer is removed to form a heat sink and a plurality of leads. The heat sink, the leads and the tape together form a tape carrier.

This invention also provides a second method of fabricating a tape carrier. First, a tape having a device opening and a plurality of outer lead openings thereon is provided. A conductive layer having a plurality of bumps thereon is provided. These bumps correspond in position to the device opening and the outer lead openings on the tape. The tape and the conductive layer are attached to each other. Outer lead contacts each connected electrically with a corresponding outer lead are formed inside the outer lead openings. A portion of the conductive layer is removed to form a heat sink and a plurality of leads. The heat sink, the leads and the tape together form a tape carrier.

In this invention, the device opening and the outer lead openings on the tape are formed by stamping the tape and the bumps on the conductive layer are formed by half-etching, for example.

A resinous layer may form over the tape after joining the tape and the conductive layer together but before the removing a portion of the conductive layer.

An electrical contact such as a gold stud bump may form over each of the bonding pads before conducting the thermal compression operation. Furthermore, adhesive glue may be applied on the active surface of the chip to form an adhesive glue layer before conducting the thermal compression operation.

In addition, an electroplated layer such as a nickel/alloy layer or a lead-tin alloy layer may form over the heat sink and the leads after the heat sink and the leads are formed over the tape carrier.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
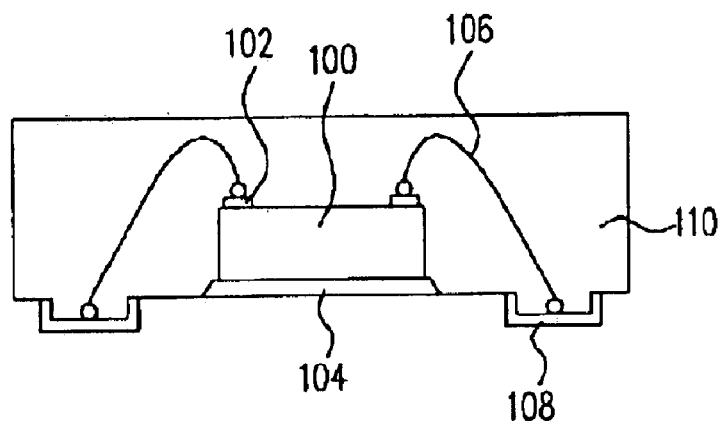
FIG. 1 is a schematic cross-sectional view of a conventional bump chip carrier package.
Figure 2:
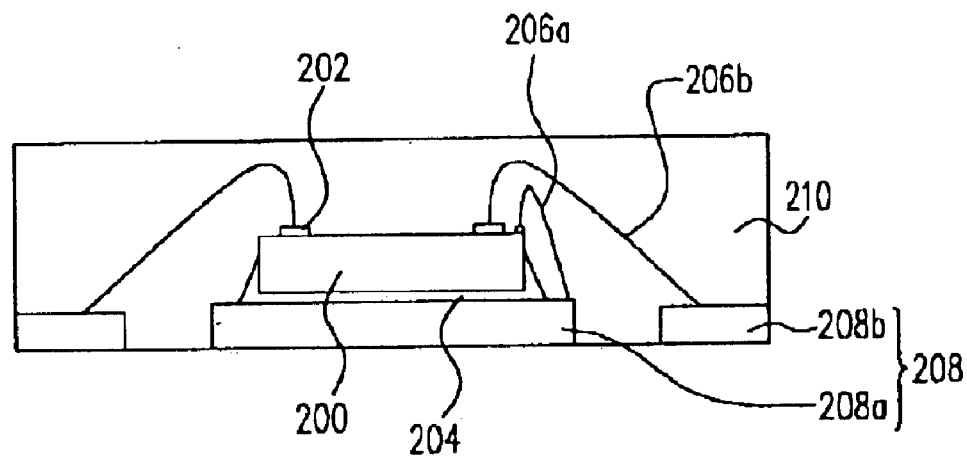
FIG. 2 is a schematic cross-sectional view of a conventional quad flat nonleaded package.
Figure 3:
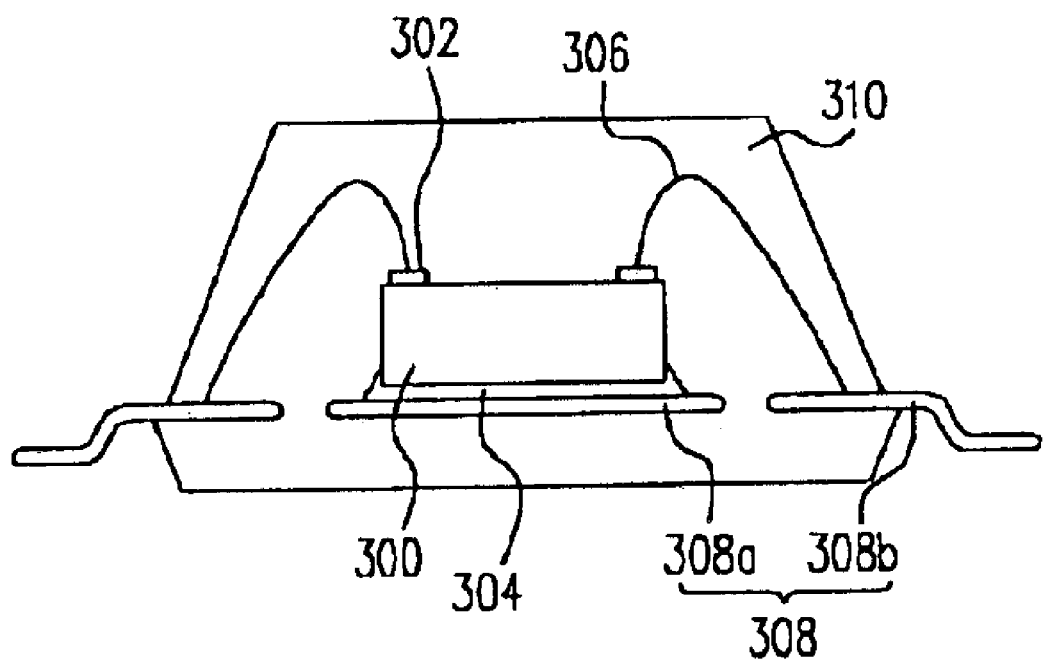
FIG. 3 is a schematic cross-sectional view of a conventional lead frame type of package.

Reference will now be made in detail to the present preferred embodiments of the invention, examples of which are illustrated in the accompanying drawings. Wherever possible, the same reference numbers are used in the drawings and the description to refer to the same or like parts.

Figure 4A:
FIGS. 4A to 4F are schematic cross-sectional views showing the progression of steps for fabricating a tape automated bonding package according to a first embodiment of this invention.

FIGS. 4A to 4F are schematic cross-sectional views showing the progression of steps for fabricating a tape automated bonding package according to a first embodiment of this invention. First, as shown in FIG. 4A, a conductive layer 408 having a plurality of bumps thereon is provided. The conductive layer 408 is a metallic layer such as a copper layer. The bumps on the conductive layer 408 are formed, for example, by half-etching.

Figure 4B:
Figure 4B:
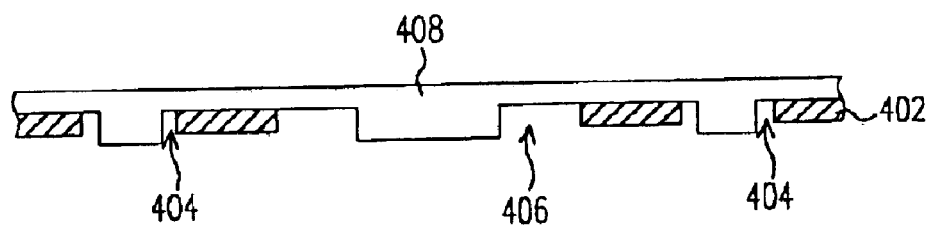

A tape 402 made from polyimide material, for example, is provided as shown in FIG. 4B. The tape 402 is attached to the conductive layer 408. The tape 402 has a plurality of openings 404 and a device opening 406 thereon. The device opening 406 is located in the middle of the tape 402 and the openings 404 are positioned around the device opening 406, for example. After placing the tape 402 under the conductive layer 408, the bumps on the conductive layer 408 will pass through the openings 404 and the device opening 406.

Figure 4C:
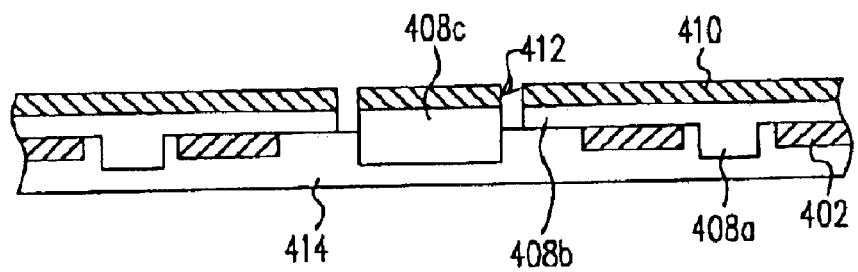

As shown in FIG. 4C, a resin layer 414 is formed over the tape 402. Thereafter, a portion of the conductive layer 408 is removed to form a plurality of leads each having an inner lead section 408a and an outer lead section 408b and a heat sink 408c. The conductive layer 408 is patterned, for example, by first forming a photoresist layer 410 with an opening 412 thereon over the conductive layer 408. The photoresist layer 410 with the opening 412 thereon is formed by coating photoresist material over the conductive layer 408 followed by photo-exposure, and development. Using the photoresist layer 410 as a mask, the exposed conductive layer 408 is removed by etchant. Finally, the resinous layer 414 is removed from the tape 402.

Figure 4D:
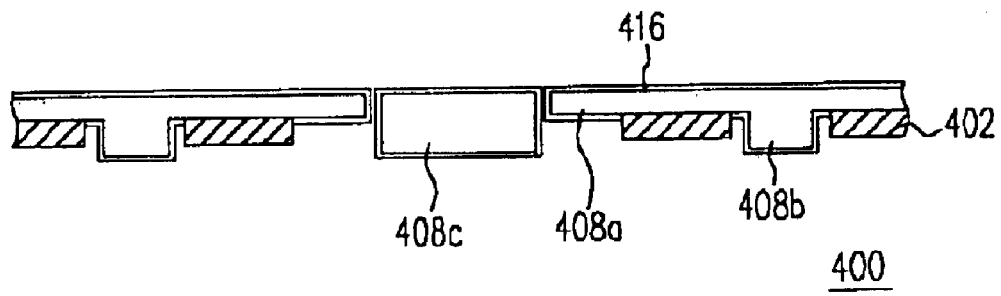

As shown in FIG. 4D, a nickel/gold layer 416 is formed on the exposed surface of the inner lead 408a, the outer lead 408b and the heat sink 408c, for example, by electroplating.

Figure 4E:
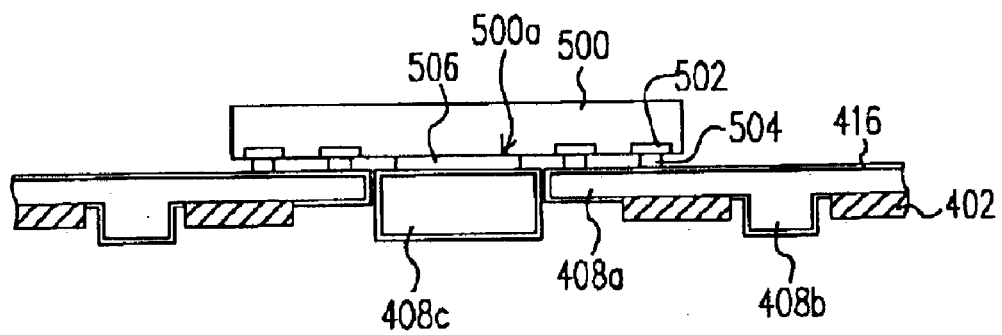

As shown in FIG. 4E, a chip 500 having an active surface 500a is provided. The active surface 500a has a plurality of bonding pads 502 thereon. To facilitate the attachment of the chip 500 onto the tape carrier 400, electrical contacts 504 are formed on the respective bonding pads 502 of the chip 500 first. The electrical contacts 504 are metallic bumps such as gold stud bumps or solder stud bumps. The gold stud bumps are formed, for example, by wire bonding or electroplating. A thermal compression operation is next conducted so that the chip 500 and the tape carrier 400 are electrically connected through the electrical contacts 504. In addition, before joining the chip 500 and the tape carrier 400 together, adhesive glue 506 may be applied to the active surface 500a of the chip 500 or the heat sink 408c first. The adhesive glue layer 506 between the chip 500 and the tape carrier 400 serves as a heat conductive medium for channeling heat away from the chip 500.

Figure 4F:
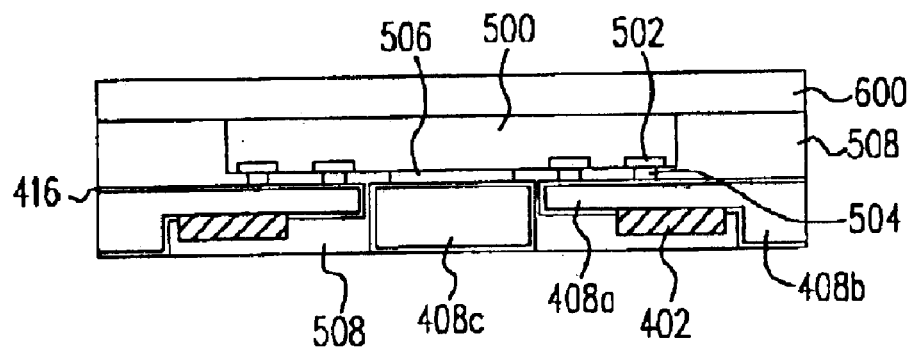

As shown in FIG. 4F, a resin encapsulation process is carried out to enclose the chip 500 and the tape carrier 400 inside an integrative package body 508. The package body 508 encapsulates most of the chip 500 and the tape carrier 400 so that only the backside of the chip 500 and the outer leads 408b on the tape carrier 400 are exposed. After the encapsulation process, a dicing process is carried out to separate the array of packages into individual packages. Finally, another heat sink 600 is attached to the backside of the chip 500 and over a portion of the package body 508. Thus, the steps necessary for fabricating a tape automated bonding package are completed.

Figure 5A:
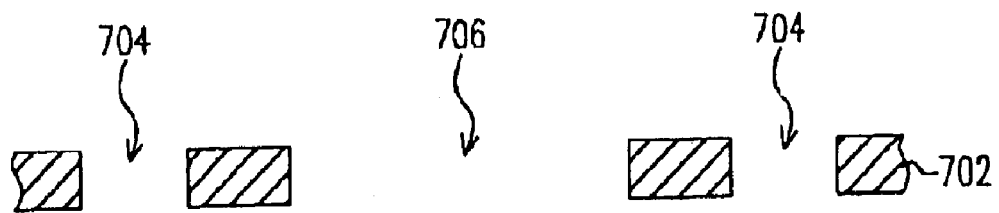
FIGS. 5A to 5G are schematic cross-sectional views showing the progression of steps for fabricating a tape automated bonding package according to a second embodiment of this invention.

FIGS. 5A to 5G are schematic cross-sectional views showing the progression of steps for fabricating a tape automated bonding package according to a second embodiment of this invention. As shown in FIG. 5A, a tape 702 having a plurality of openings 704 and a device opening 702 thereon is provided. The device opening 706 is located in the middle of the tape 702 while the openings 704 are positioned around the device opening 706. The tape 702 is typically made, for example, from a polyimide material.

Figure 5B:
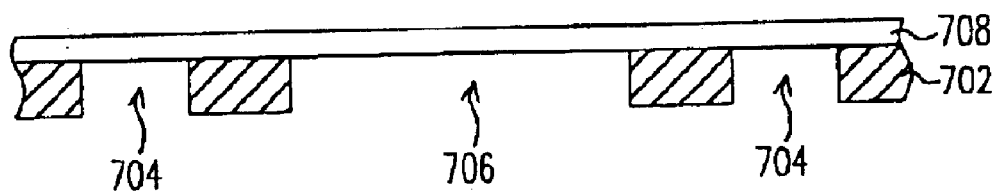

As shown in FIG. 5B, a conductive layer 708 is provided. The conductive layer 708 is attached to the tape 702. In this embodiment, the conductive layer 708 is a slab of conductive material such as copper with planar surfaces.

Figure 5C:
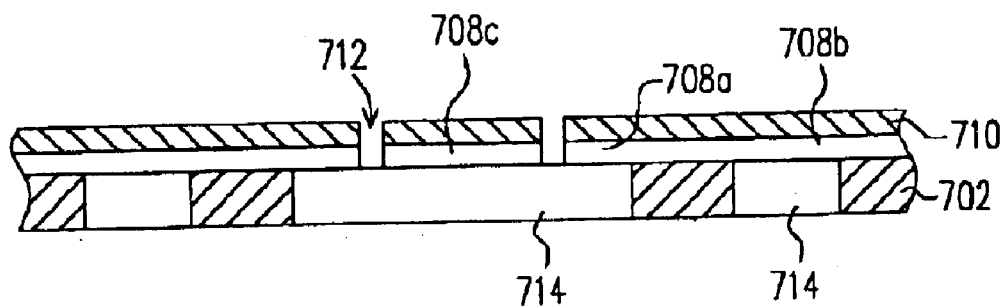

As shown in FIG. 5C, a resin layer 714 is formed over the tape 702. Thereafter, a portion of the conductive layer 708 is removed to form leads each having an inner lead section 708a and an outer lead section 708b and a heat sink 708c. The conductive layer 708 is patterned, for example, by forming a photoresist layer 710 having an opening 712 thereon over the conductive layer 708 and the using the photoresist layer 710 as a mask to etch away the exposed conductive layer.

Figure 5D:
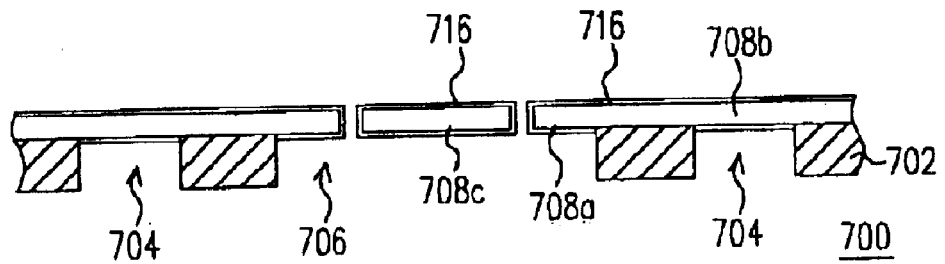

As shown in FIG. 5D, a nickel/gold layer 716 or a lead-tin alloy layer is formed over the exposed surface of the inner leads 708a, the outer leads 708b and the heat sink 708c, for example, by electroplating. This completes the steps necessary for fabricating a tape carrier 700.

Figure 5E:
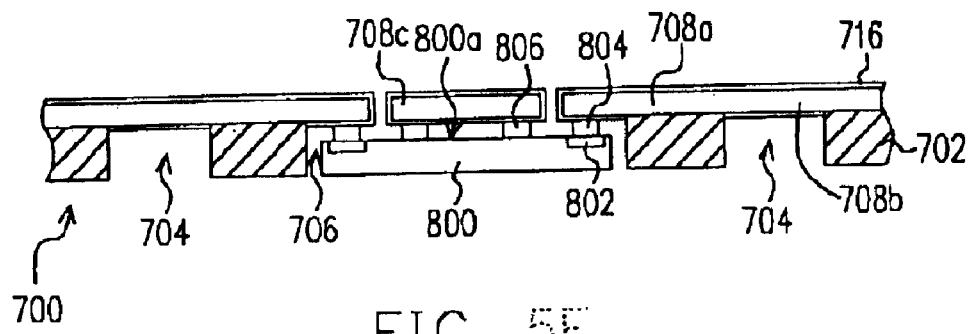

As shown in FIG. 5E, a chip 800 having an active surface 800a is provided. The active surface 800a has a plurality of bonding pads 802 thereon. To facilitate the attachment of the chip 800 onto the tape carrier 700, electrical contacts 804 are formed on the respective bonding pads 802 of the chip 800 first. The electrical contacts 804 are metallic bumps such as gold stud bumps or solder stud bumps. The gold stud bumps are formed, for example, by wire bonding or electroplating. A thermal compression operation is next conducted so that the chip 800 and the tape carrier 700 are electrically connected through the electrical contacts 804. In addition, before joining the chip 800 and the tape carrier 700 together, adhesive glue 806 may be applied to the active surface 800a of the chip 800 or the heat sink 708c first. The adhesive glue layer 806 between the chip 800 and the tape carrier 700 serves as a heat conductive medium for channeling heat away from the chip 800.

Figure 5F:
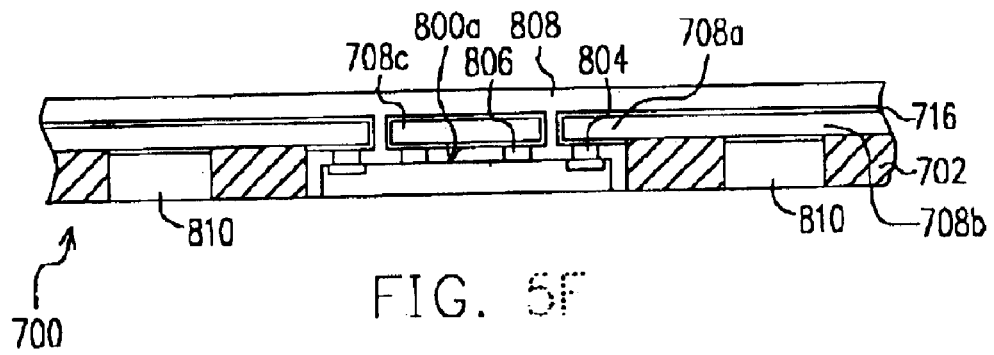

As shown in FIG. 5F, a encapsulation process is carried out to enclose the chip 800 and the tape carrier 700 inside an integrative package body 808. The package body 808 encapsulates most of the chip 800 and the tape carrier 700 so that only the backside of the chip 800 and the outer leads 708b on the tape carrier 700 are exposed. Note that the package body 808 does not cover the openings 704 because the openings 704 are subsequently used to accommodate outer lead contacts 810. In this embodiment, the outer lead contacts 810 are made, for example, from lead-tin alloy material or other conductive material. However, anyone familiar with the technologies may use other methods of forming the outer lead contacts 810. For example, half-etching technique may be applied to the conductive layer 708 in FIG. 5B to form bumps that correspond to the aforementioned outer lead contacts 810.

Figure 5G:
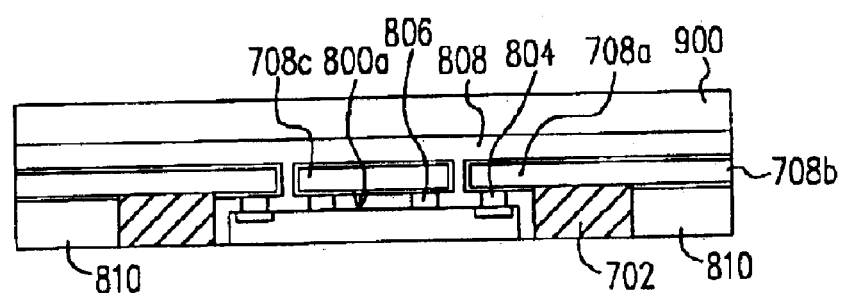

After forming the outer lead contacts 810, the packages in an array are separated into individual packages. Finally, as shown in FIG. 5G, another heat sink 900 is attached to the backside of the chip 800 over a portion of the package body 808. This completes the steps necessary for fabricating a tape automated bonding package.

Figure 6:
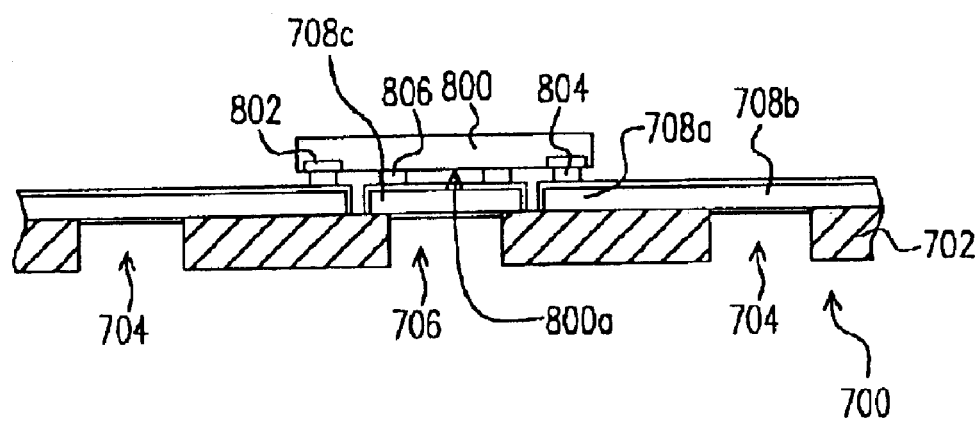
FIG. 6 is schematic cross-sectional view showing the structure after joining a chip and a tape carrier together according to a third embodiment of this invention.

FIG. 6 is schematic cross-sectional view showing the structure after joining a chip and a tape carrier together according to a third embodiment of this invention. As shown in FIGS. 5E and 6, the tape carrier 700 and the chip 800 are joined together differently. In the second embodiment (FIG. 5E), the chip 800 is positioned inside the device opening 706. In this embodiment, however, the chip 800 is positioned above the device opening 706.

In the aforementioned first, second and third embodiments of this invention, dimensions of the chip package are suitable for housing a single chip. However, anyone familiar with the technologies may vary some parameters in the package design so that the tape carrier can accommodate a plurality of chips and form a multichip package.

In conclusion, the tape automated bonding package and method of fabricating the same has at least the following advantages:

1. Area occupation and overall thickness of the TAB package are reduced so that the package is promoted to a higher level of miniaturization.

2. The heat sink at the back of the chip provides a good electromagnetic shield for the TAB package.

3. Conductive wires are not used as a connecting medium so that the packaging volume can be reduced.

4. The TAB package structure not only accommodates flip chips, but also allows direct electrical connection between a wire-bond chip and a lead frame without any intermediate redistribution circuits. Thus, overall circuit length is reduced and problems caused by parasitic inductance are attenuated. Furthermore, development time and cost for new chip packages are reduced.

5. Using mature thermal compression technique instead of wire bonding operation, the packages can have a higher overall yield and reliability. In addition, the shortening of circuit path also improves the electrical performance of the package.

6. Since the tape carrier and the chip are not joined by solder material, bump pitch can be reduced to about 45 μm.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A tape automated bonding (TAB) package structure, comprising:

a tape carrier having:

a tape having a device opening and a plurality of outer lead openings;

a plurality of leads on the tape, wherein each lead includes an inner lead section and an outer lead section, and the outer leads are exposed through the outer lead openings; and a first heat sink on the tape in a position corresponding to the device opening;

a chip on the tape carrier, wherein the chip has an active surface and the active surface has a plurality of bonding pads thereon;

a plurality of electrical contacts placed between the bonding pads and the inner leads, wherein the first heat sink is attached onto the active surface among the bonding pads and arranged among the inner leads, wherein the leads have protrusions that have a lower surface coplanar with that of the first heat sink.

2. The TAB package structure of claim 1, wherein the tape is made of polyimide.

3. The TAB package structure of claim 1, wherein the leads are made of copper.

4. The TAB package structure of claim 1, wherein the electrical contacts include gold stud bumps.

5. The TAB package structure of claim 1, wherein the package further includes a nickel/gold layer on the surface of the first heat sink and the leads.

6. The TAB package structure of claim 1, wherein the package further includes an adhesive glue layer between the active surface of the chip and the first heat sink.

7. The TAB package structure of claim 1, wherein the package further includes a second heat sink attached to the chip and over a plastic package body of the package.

8. The TAB package structure of claim 1, further comprising a plastic package body encapsulating the chip and th tape carrier.

* * * * *